(12) United States Patent
Khaja et al.

(10) Patent No.: US 10,971,390 B2
(45) Date of Patent: Apr. 6, 2021

(54) METHODS OF MINIMIZING WAFER BACKSIDE DAMAGE IN SEMICONDUCTOR WAFER PROCESSING

(71) Applicant: Applied Materials, Inc., Santa Clara, CA (US)

(72) Inventors: Abdul Aziz Khaja, San Jose, CA (US); Liangfa Hu, San Jose, CA (US); Sudha S. Rathi, San Jose, CA (US); Ganesh Balasubramanian, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/437,048

(22) Filed: Jun. 11, 2019

(65) Prior Publication Data

US 2019/0393072 A1 Dec. 26, 2019

Related U.S. Application Data

(60) Provisional application No. 62/688,753, filed on Jun. 22, 2018.

(51) Int. Cl.
*H01L 21/687* (2006.01)
*H01L 21/67* (2006.01)

(52) U.S. Cl.
CPC .. *H01L 21/68735* (2013.01); *H01L 21/67288* (2013.01); *H01L 21/6875* (2013.01); *H01L 21/68757* (2013.01); *Y10T 279/23* (2015.01)

(58) Field of Classification Search
CPC . B23B 31/28; Y10T 279/23; H01L 21/68757; H01L 21/6875; H01L 21/6833; H01L 21/6831; H01L 21/67103; H01L 21/67248; H01L 21/68735; H01L 21/67288

See application file for complete search history.

(56) References Cited

U.S. PATENT DOCUMENTS 5,583,736 A 12/1996 Anderson et al.
7,824,498 B2 * 11/2010 Parkhe ................ H01L 21/6831
118/728
9,613,846 B2 4/2017 Raj et al.
(Continued)

OTHER PUBLICATIONS

Unpublished U.S. Appl. No. 16/403,097, filed May 3, 2019, entitled : "Extreme Uniformity Heated Substrate Support Assembly".
(Continued)

*Primary Examiner* — Chwen-Wei Su
(74) *Attorney, Agent, or Firm* — Patterson + Sheridan, LLP (57) ABSTRACT

The present disclosure generally relates to substrate supports for semiconductor processing. In one embodiment, a substrate support is provided. The substrate support includes a body comprising a substrate chucking surface, an electrode disposed within the body, a plurality of substrate supporting features formed on the substrate chucking surface, wherein the number of substrate supporting features increases radially from a center of the substrate chucking surface to an edge of the substrate chucking surface, and a seasoning layer formed on the plurality of the substrate supporting features, the seasoning layer comprising a silicon nitride.

20 Claims, 4 Drawing Sheets

(56) References Cited

U.S. PATENT DOCUMENTS

| | | |
|---|---|---|
| 2007/0082466 A1* | 4/2007 | Shim .................. C23C 16/507 |
| | | 438/478 |
| 2007/0217117 A1 | 9/2007 | Ohta et al. |
| 2010/0039747 A1 | 2/2010 | Sansoni et al. |
| 2014/0063680 A1 | 3/2014 | Fukasawa et al. |
| 2014/0238609 A1* | 8/2014 | Tomioka ............ H01L 21/6875 |
| | | 156/345.53 |
| 2015/0311108 A1 | 10/2015 | Horiuchi |
| 2016/0049323 A1* | 2/2016 | Ye ...................... H01L 21/6833 |
| | | 361/234 |
| 2016/0064264 A1 | 3/2016 | Kulshreshtha et al. |
| 2016/0230269 A1 | 8/2016 | Raj et al. |
| 2017/0243778 A1 | 8/2017 | Kouno et al. |
| 2018/0148835 A1* | 5/2018 | Erickson ............ C23C 16/4411 |

OTHER PUBLICATIONS

International Search Report and Written Opinion from PCT/US2019/035073 dated Sep. 20, 2019.

\* cited by examiner

FIG. 4

METHODS OF MINIMIZING WAFER BACKSIDE DAMAGE IN SEMICONDUCTOR WAFER PROCESSING

CROSS-REFERENCE TO RELATED APPLICATIONS

This application claims benefit of U.S. provisional patent application Ser. No. 62/688,753, filed Jun. 22, 2018, which is herein incorporated by reference.

BACKGROUND

Field

Embodiments of the present disclosure generally relate to substrate supports for semiconductor processing.

Description of the Related Art

An electrostatic chuck holds and supports a substrate during a manufacturing process without mechanically clamping the substrate. During use of an electrostatic chuck, the backside of a substrate, such as a semiconductor wafer, is held to the face of the electrostatic chuck by an electrostatic force that is provided from one or more electrodes embedded in the surface of the electrostatic chuck. The surface of the electrostatic chuck may be flat or may have one or more protrusions, projections or other substrate supporting features that further raise up the substrate to remove heat from the substrate.

The number of layers and layer thicknesses to form semiconductor devices have increased. The increased layers deposited on the front side of the substrate can result in bowing of the substrate (i.e., a deflection of the substrate across a diameter thereof) during high processing temperatures. The bowing of the substrate may cause defocus or out-of-focus issues during a lithography process. For example, during exposure, substrate warpage induced focus drift negatively affects critical dimension (CD) uniformity. Conventional electrostatic chucks are unable to adequately chuck the increased deflection of the substrates partially due to inability to provide strong enough chucking force or arcing if high chucking voltages is used. In addition, the substrate supporting features (e.g., protrusions or projections) may be worn due to repetitive chucking or de-chucking and cause damage to backside layers or surfaces of the substrate, which in turn damages or otherwise affects the layers deposited on the front surface of the substrate. Therefore, there is a need for improved electrostatic chucking devices that can address these issues.

SUMMARY

The present disclosure generally relates to substrate supports for semiconductor processing. In one embodiment, a substrate support is provided. The substrate support includes a ceramic body that has a substrate chucking surface. An RF electrode is disposed within the ceramic body. A heating element is embedded in the ceramic body. A plurality of substrate supporting features is formed on the substrate chucking surface. The number of substrate supporting features increases radially from a center of the substrate chucking surface to an edge of the substrate chucking surface. A seasoning layer is formed on the plurality of the substrate supporting features. The seasoning layer includes silicon nitride, silicon, or silicon oxide.

In another embodiment, the substrate support includes a body comprising a substrate chucking surface, the substrate chucking surface having an inner region and an outer region surrounding the inner region, an electrode disposed within the body, a ledge formed about a periphery of the body, the ledge surrounding the outer region, and a plurality of substrate supporting features formed on the substrate chucking surface, the plurality of the substrate supporting features having a first density in the inner region and a second density in the outer region, wherein a ratio of the second density to the first density is about 4:1 to about 10:1.

In yet another embodiment, the substrate support includes a body comprising a substrate chucking surface, an electrode disposed in the body, a temperature control device disposed in the body, an edge ring disposed about a periphery of the substrate chucking surface, a plurality of substrate supporting features formed on the substrate chucking surface, wherein the substrate supporting features have a total number of about 1000 or greater, and the number of substrate supporting features increases radially from a center of the substrate chucking surface to the edge ring, and a seasoning layer formed on the plurality of the substrate supporting features, the seasoning layer comprising a silicon oxide and silicon nitride.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
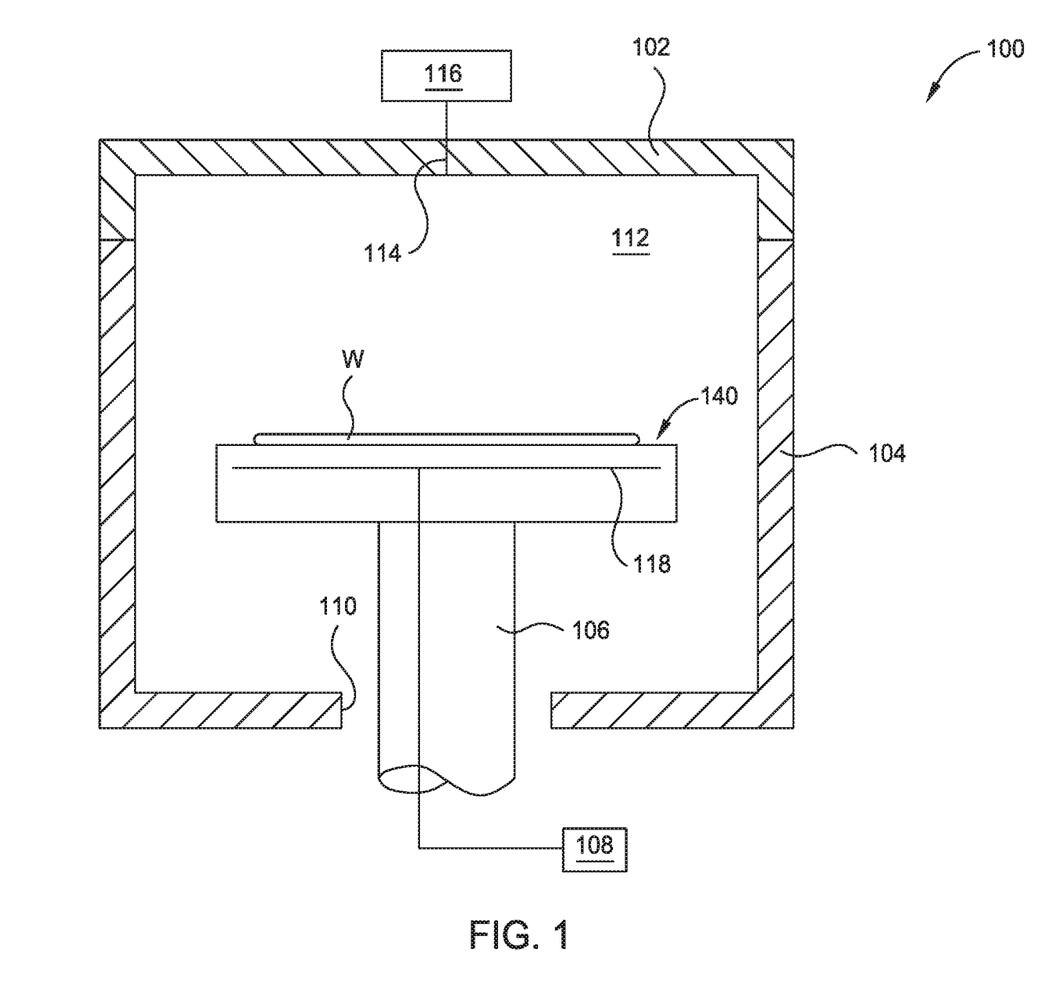
FIG. 1 is a schematic arrangement of a processing chamber according to an embodiment of the disclosure.

FIG. 1 is an exemplary processing chamber 100 having a substrate support 140 therein. The processing chamber 100 generally includes a lid 102 and a chamber body 104 coupled to the lid 102 to define a processing volume 112 therein. A process gas inlet 114 may be formed though the lid 102 for providing a process gas from a gas source 116 into the processing volume 112. Alternatively, the process gas inlet 114 may be formed in the chamber body 104 to provide lateral process gas from the sidewall of the processing chamber 100. In some embodiments, one or more process gas inlets may be formed at the lid 102 and the chamber body 104. A shaft 106 extends into the processing volume 112 through an opening 110 in a bottom of the chamber body 104. The shaft 106 is coupled to and supports the substrate support 140. A power source 108 is coupled to an electrode 118 disposed within the substrate support 140 through the shaft 106. The power source 108 biases the electrode 118 to chuck the substrate W to the substrate support 140. In one example, the substrate support 140 is an electrostatic chuck.

A substrate W is shown disposed on the substrate support 140. The substrate W may be a material such as crystalline silicon (e.g., Si<100> or Si<111>), silicon oxide, strained silicon, silicon germanium, germanium, doped or undoped polysilicon, doped or undoped silicon wafers, patterned or non-patterned wafers, silicon on insulator (SOI), carbon doped silicon oxides, silicon nitride, doped silicon, gallium arsenide, glass, or sapphire. The substrate W may have various dimensions, such as 200 mm, 300 mm, 450 mm or other diameter, and can be a circular, rectangular or square panel. The substrate W may have one or more layers formed on the backside of the substrate W, such as silicon oxide, silicon nitride, amorphous silicon, or any combination thereof (collectively referred to as backside layers). In one embodiment, the backside layer is a tri-layer stack including silicon nitride, amorphous silicon, and silicon oxide, with the silicon nitride being in physical contact with the backside of the substrate.

The substrate support 140 may be used with any suitable processing chambers, including processing chambers not illustrated. Suitable processing chambers may include, but are not limited to, deposition chambers or etch chambers. An exemplary deposition chamber may be a chemical vapor deposition (CVD) or a plasma enhanced chemical vapor deposition (PECVD) chamber. An exemplary etch chamber may be a plasma etch chamber.

Figure 2:
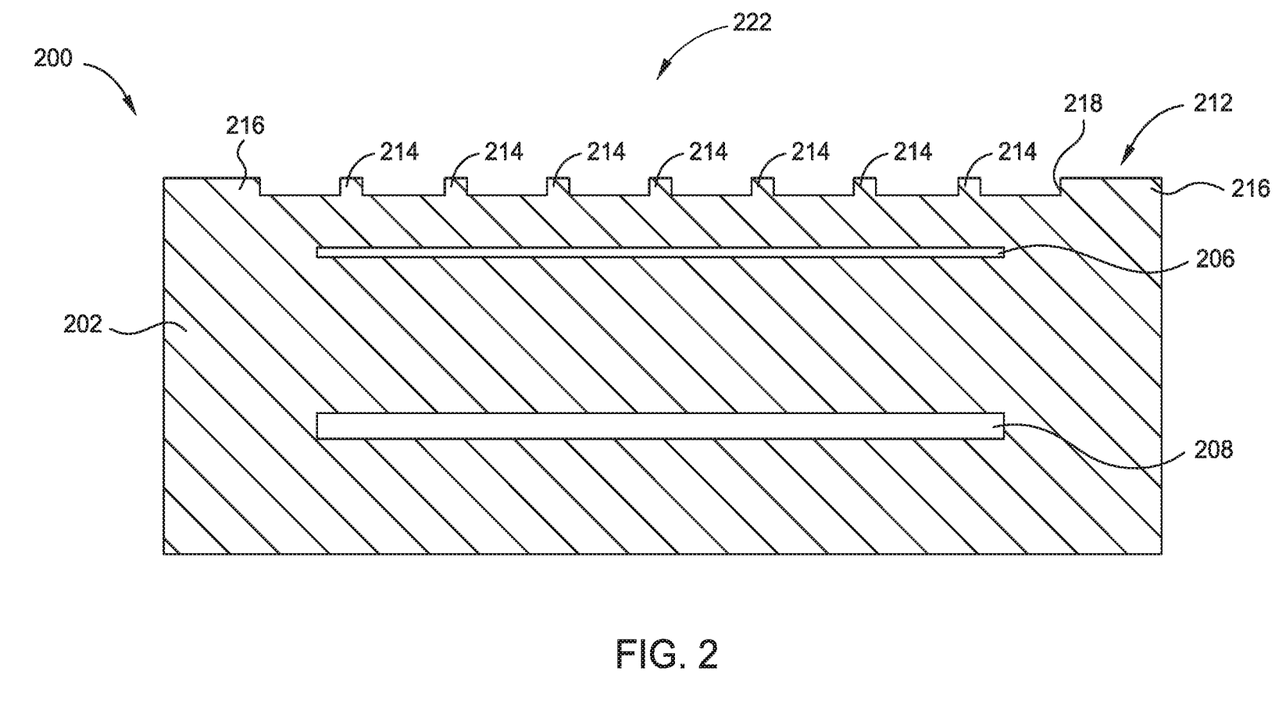
FIG. 2 is a cross-section of an exemplary substrate support according to an embodiment of the disclosure.

FIG. 2 is a cross-sectional view of an exemplary substrate support 200. The substrate support 200 may be used as the substrate support 140 of FIG. 1. The substrate support 200 has a body 202. The body 202 is made from a dielectric material, such as a ceramic like aluminum oxide, or aluminum nitride. A temperature control device 208 may be disposed within the body 202 to heat or cool the substrate support 200 to a desired temperature. In one example, the temperature control device 208 is a resistive heater. In another embodiment, the temperature control device 208 is a channel adapted to flow a heated or cooled fluid, such as air, nitrogen, helium, water, glycol, or the like, therethrough to conduct heat to and/or from the body 202. The temperature control device 208 can raise the temperature of the substrate support 200 to a temperature above 350 degrees Celsius, such as above 550 degrees Celsius, for example, about 650 degrees Celsius. An electrode 206 is also disposed within the body 202. The electrode 206 is coupled to a power source (such as power source 108 in FIG. 1) which provides an electric charge thereto to chuck a substrate to the substrate support 200. The electrode 206 may be a single component or discrete sections across the diameter of the body 202 as shown, forming either a monopolar or bipolar chuck. While not shown, it is contemplated that the electrode 206 may be arranged in any pattern, such as a grid, circular, zig-zag, serpentine etc.

The body 202 has a substrate chucking surface 212. A ledge 216 may be formed about a periphery of the body 202 to define the substrate chucking surface 212 therein. The ledge 216 may have a width of about 0.5 mm to about 10 mm, for example about 1 mm to about 5 mm. The ledge 216 defines a recess 218 in the body 202 radially inward of the ledge 216. A plurality of substrate supporting features 214 is disposed in the recess 218. The substrate supporting features 214 extend upwardly from a surface of the recess 218 to define an interior region 222 of the substrate chucking surface 212. The substrate supporting features 214 may be, for example, cylindrical dimples, ridges, hemispherical protrusions, or the like. In one embodiment, the substrate supporting features 214 extend from the recess 218 at a height of about 10 µm to about 50 µm. The top surface of the substrate supporting features 214 and the top surface of the ledge 216 may be coplanar or at different heights. The substrate supporting features 214 may have a diameter from about 1 mm to about 6 mm, such as about 2 mm to about 4 mm.

In some embodiments, the ledge 216 is omitted. Instead, an edge ring (not shown) may be disposed at the periphery of the substrate chucking surface 212. The edge ring may have a height of about 10 µm to about 50 µm and a width of about 0.5 mm to about 10 mm, for example about 1 mm to about 5 mm. In such a case, the edge ring defines an interior region, such as the interior region 222, radially inward of the edge ring where the substrate supporting features 214 may be disposed.

Figure 3:
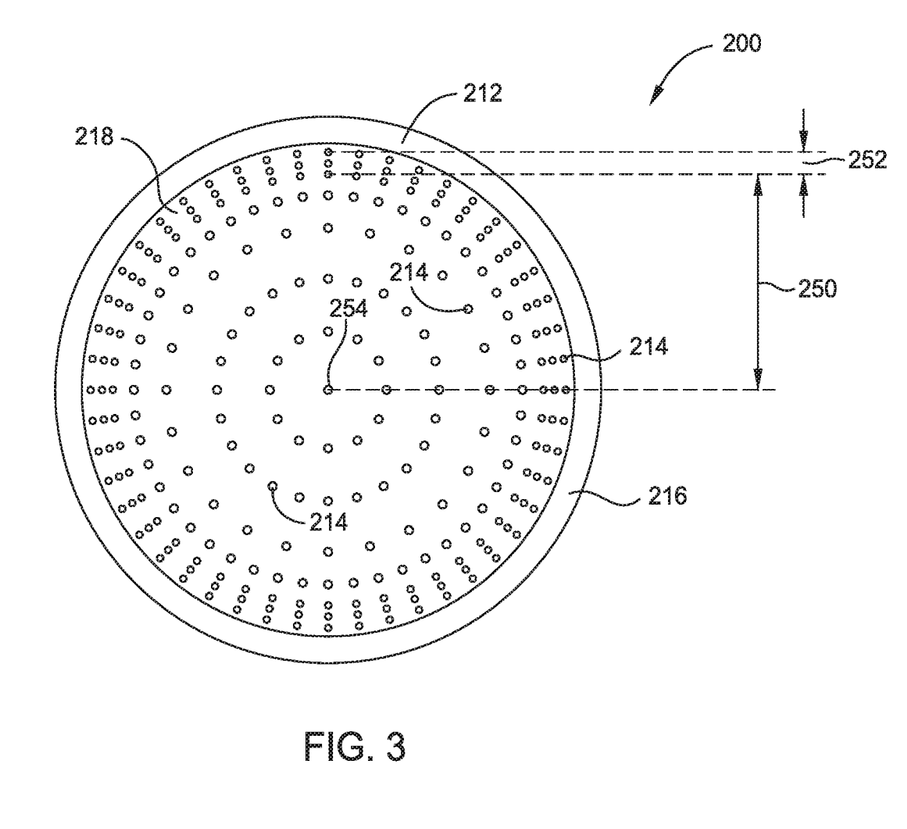
FIG. 3 is a top down view of the substrate support of FIG. 2.

To address the issues of conventional electrostatic chucks, various approaches and features of the disclosed substrate supports are provided to reduce backside damage to the substrate. FIG. 3 is a top down view of the substrate support 200 showing the substrate chucking surface 212 according to embodiments of the present disclosure. The substrate supporting features 214 are shown surrounded by the ledge 216. In one embodiment, the number of substrate supporting features 214 can be increased to be greater than 120, such as about 500 or above, such as about 800 or greater, for example 1000 or greater, for example about 1500 to about 2000. The minimum distance between the substrate supporting features 214 may be about 0.1 mm to about 0.5 mm. By increasing the number of substrate supporting features 214, the force for chucking a substrate to the substrate chucking surface 212 can be evenly shared by the increased number of the substrate supporting features 214. With this approach, the impact to the substrate supporting features 214 due to repetitive chucking and de-chucking is reduced. Therefore, the substrate supporting features 214 do not wear out quickly and form sharp irregularities on the surface of the substrate supporting features 214 that would cause damage to the backside layers of the substrate.

Increasing the number of substrate supporting features 214 is also beneficial because the area provided for chucking a substrate to the substrate chucking surface 212 is greatly increased. In one embodiment as shown, the number of substrate supporting features 214 (i.e., density) is greater at an outer region 252 of the recess 218 near the ledge 216 than at an inner region 250 of the recess 218. That is, the substrate supporting features 214 are greater in number per unit area at a periphery of the substrate chucking surface 212 of the substrate support 200 than at the inner region thereof. The inner region 250 is surrounded by the outer region 252. In some embodiments, the radial distribution of the substrate supporting features 214 is greater towards the periphery of the substrate chucking surface 212 than at the inner region thereof. In one embodiment shown in FIG. 3, the number of substrate supporting features 214 increases radially outward from a center 254 of the substrate chucking surface 212 (or the inner region) to the ledge 216 (or an outer periphery of the outer region 252). In cases where the ledge is not included, the number of substrate supporting features 214 may be increased radially outward from the center 254 to an edge of the substrate chucking surface 212. In any case, a chucking force applied to a substrate disposed on the substrate chucking surface 212 can be increased at the outer region 252 thereof, thereby allowing a highly bowed substrate, such as 1 mm or higher of deflection, to be held (i.e, "chucked") by the substrate support 200. This can significantly improve the chucking performance and help minimize the chucking voltage required to chuck highly bowed substrates at the outer region. Since the increased number of substrate supporting features 214 lower the chucking voltage (i.e., lower chucking force) required at the outer region 252, the damages to the backside layers of the substrate can be minimized.

The inner region 250 has a radial distance and the outer region 252 has a radial distance, and the radial distance of the inner region 250 and the radial distance of the outer region 252 can be at a ratio of about 1:1 to about 4:1, for example about 2:1 to about 3:1. In cases where the substrate chucking surface 212 is configured to process a 300 mm substrate, the radial distance of the inner region 250 may be about 80 mm to about 115 mm, for example about 100 mm, measuring from the center 254 of the substrate chucking surface 212. The radial distance of the outer region 252 may be about 30 mm to about 65 mm, for example about 50 mm, measuring from the outer periphery of the inner region 250 to the edge of the substrate chucking surface 212 (e.g., an interface between the substrate chucking surface 212 and the ledge 216). The number of substrate supporting features 214 in the outer region 252 may have a first density (e.g., number per unit area) and the number of substrate supporting features 214 in the inner region 250 may have a second density. In some embodiments, the ratio of the first density to the second density may be about 1:1 or greater, for example about 2:1 or greater, such as about 4:1 to about 10:1.

The substrate supporting features 214 may be arranged in concentric circles as shown in FIG. 3. Other arrangement of substrate supporting features 214 is also contemplated. For example, the substrate supporting features 214 can be arranged in a pattern of increasing diameter with radial distance, or vice versa. That is, the substrate supporting features 214 can have diameters gradually increased in a radially outward direction from the center 254 to the edge of the substrate chucking surface 212. This approach can be combined with any of the embodiments described in this disclosure to provide higher chucking force at the outer region 252 than the inner region 250.

The disclosed support 200 may additionally or alternatively include other features to reduce the damage to the backside layers of the substrate. For example, it has been observed that sharp irregularities on the substrate chucking surface 212 may punch through the backside layers and damage the front surface of the substrate and the layers deposited thereon. Reducing the average surface roughness (Ra) of the substrate supporting features 214 can minimize any irregular asperities on the substrate chucking surface 212 contacting the backside of the substrate, thereby reducing the damage to the backside layers of the substrate. In various embodiments, the substrate supporting features 214 can have an Ra of about 65 μm or less, such as about 50 μm or less, for example 1 μm to about 40 μm. In one embodiment, the Ra of the substrate supporting features 214 is about 15 μm to about 20 μm.

Figure 4:
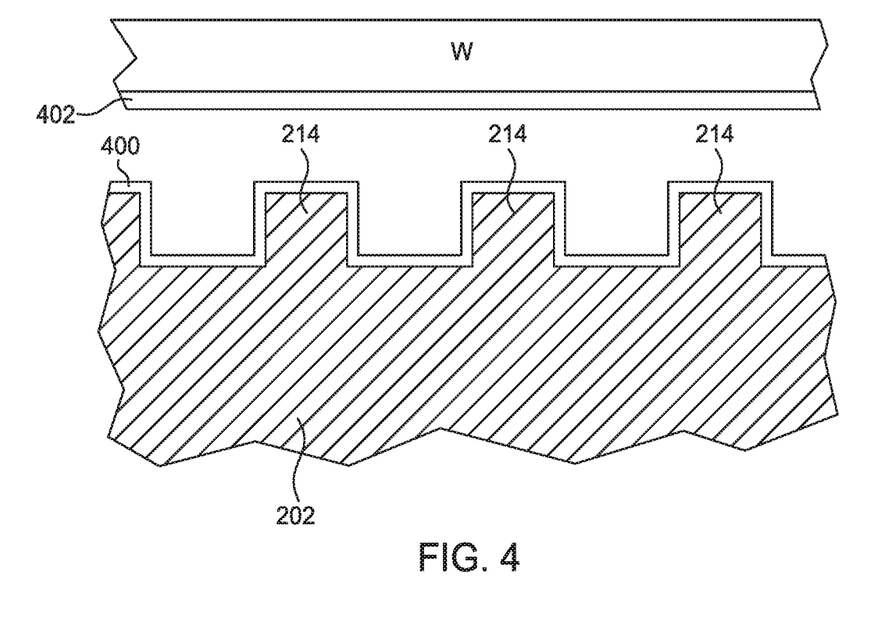
FIG. 4 is an enlarged view showing a portion of a substrate to be supported supporting features according to an embodiment of the disclosure.

In some embodiments, a seasoning layer can be deposited on at least the substrate supporting features 214 to protect the backside layers of the substrate from being damaged by any irregularities found on the substrate chucking surface 212. FIG. 4 is an enlarged view showing a portion of the substrate supporting features 214 prior to supporting a substrate W. A seasoning layer 400 is formed on the surface of the substrate supporting features 214. The seasoning layer 400 may be conformally formed on the exposed surface of the substrate supporting features 214. Alternatively, the seasoning layer 400 may be selectively formed on the top surface of the substrate supporting features 214 without going in the valleys between the substrate supporting features 214. In some cases, the seasoning layer 400 can be extended to cover the ledge 216 and/or the entire substrate chucking surface 212 (FIG. 2). The seasoning layer 400 can have a hardness that has minimized impact to the backside layers when contacting the substrate. For example, the seasoning layer 400 may have a hardness in the range between about 2 GPa to about 50 GPa, for example about 5 GPa to about 30 GPa. Suitable material may include, but is not limited to, silicon, silicon nitride, silicon oxide, carbon doped silicon oxide (SiOC), silicon carbide (SiC), nitrogen containing silicon carbide (SiCN), aluminum oxide, aluminum nitride, undoped silicon glass (USG), such as silicon oxide, boron-silicate glass (BSG), phosphorus-silicate glass (PSG), or boron-phosphorus-silicate glass (BPSG), or any combination thereof. Other materials, such as those have lower hardness and are resistant to degradation from exposure to the chemistry used in the processing of a substrate, may also be used.

The seasoning layer 400 may be a single layer of the material listed above or a layer stack including any combination of the materials listed above. In one embodiment, the seasoning layer 400 is a bi-layer stack including silicon oxide and silicon nitride, which can be arranged in any order. In another embodiment, the seasoning layer 400 is a bi-layer stack including USG and silicon nitride, which can be arranged in any order. In yet another embodiment, the seasoning layer 400 is SiCN. It is contemplated that the seasoning layer can be adjusted or modulated affect the hardness of the seasoning layer 400 by changing the seasoning material and the deposition temperature during the seasoning process. Other factors, such as dielectric constant, breakdown voltage, and defect performance, may also be taken into consideration when selecting the seasoning material.

In any of the embodiments described above, the seasoning layer 400 can have a thickness of about 0.3 μm to about 10 μm. In one embodiment, the seasoning layer 400 is formed in-situ and has a thickness of about 0.5 μm or above, for example about 1 μm or above, such as about 1.2 μm to about 3.5 μm. In one example, the seasoning layer 400 has a thickness of about 1 μm. In one exemplary example where the seasoning layer 400 includes silicon nitride and USG, the overall thickness of the seasoning layer 400 can be 0.5 μm or 1 μm. In another exemplary example where the seasoning layer 400 is USG, the overall thickness of the seasoning layer 400 is 1 μm. In yet another exemplary example where the seasoning layer 400 is SiCN, the overall thickness of the seasoning layer 400 is 1 μm. In any case, the thickness of the seasoning layer 400 is selected to allow the Ra of the substrate supporting features 214 to be transferred to the seasoning layer 400. Therefore, the seasoning layer 400 can have the Ra that is substantially identical to that of the substrate supporting features 214. In addition, since the seasoning layer 400 improves the resistance of the substrate chucking surface 212 to degradation from exposure to the processing chemistry, the Ra of the substrate supporting features 214 can be maintained for much longer than conventional designs where no seasoning layer is formed, thereby improving the ability of the substrate support 200 to chuck highly bowed substrates at high temperatures, such as above 550 degrees Celsius, like about 650 degrees Celsius.

The seasoning layer 400 may be formed one time or in-situ between each processing operation of a substrate, such as part of a cleaning cycle of a chamber. Further, the seasoning layer 400 may be formed in-situ within the same chamber in which the substrate support 200 operates, or in a different chamber. The seasoning layer 400 may be re-applied to the substrate chucking surface 212, or at least the surface of the substrate supporting features 214 periodically. For example, the seasoning layer 400 may be re-applied onto the substrate chucking surface 212 after a predetermined number of substrates in a batch have been processed (e.g., with a film deposition or etch process). The predetermined number may be about 400 substrates or more, such as about 1000 substrates or more, for example about 2000 substrates to about 4000 substrates.

In addition to any of the approaches described herein, the overall thickness of the backside layers 402 may be increased to reduce the damage caused by the substrate supporting features 214. That is, the overall thickness of the backside layers can be increased to prevent the substrate supporting features 214 from punching through the backside layers. Punching through thicker backside layers requires a higher force with a sharp feature on the surface of the substrate supporting features 214. In such a case, the seasoning layer 400 may be optional. In one embodiment, the overall thickness of the backside layers (e.g., a multi-layer of silicon oxide, amorphous silicon, and silicon nitride) may be increased from the conventional thickness of about 0.1 µm to a thickness of about 1 µm or greater, such as about 2 µm to about 10 µm. It is contemplated that this approach can be adapted alone, or with one or more of the embodiments described in this disclosure.

In one embodiment, which can be combined with any one or more of the embodiments described herein, the substrate support 200 can be designed with specified performance parameters to improve the chucking ability thereof. In one example, the body 202 is designed to have a leakage current between about 250 milliamps and about 50 milliamps. By limiting the leakage current of the substrate support 200, the uniformity of the chucking force provided thereby is increased significantly thus improving quality of the substrate processing.

In one embodiment, which can be combined with any one or more of the embodiments described herein, the body 202 can have a desired resistivity in relation to an operating temperature thereof, such as a resistivity between about $0.1 \times 10^{10}$ Ohm-cm and about $1.0 \times 10^{11}$ Ohm-cm. For example, the body 202 can be designed to have a resistivity between about $0.1 \times 10^{10}$ Ohm-cm and about $1.0 \times 10^{11}$ Ohm-cm at about 550 degrees Celsius, such as between about $0.8 \times 10^{10}$ Ohm-cm and about $7 \times 10^{10}$ Ohm-cm. By increasing the resistivity, the voltage needed to provide an adequate chucking force is lowered thus preventing arcing of the plasma. In another example, the body 202 can be designed to have a resistivity between about $0.1 \times 10^{10}$ Ohm-cm and about $1.0 \times 10^{11}$ Ohm-cm at about 350 degrees Celsius, such as about $0.2 \times 10^{10}$ Ohm-cm and about $5 \times 10^{10}$ Ohm-cm. Increasing the resistivity results in better chucking performance at the lower temperatures, such as 650 degrees Celsius or less, for example about 550 degrees Celsius or less.

Various approaches are disclosed to eliminate or minimize damage to backside layers of the substrate. These approaches include forming a seasoning layer on at least the substrate supporting features, modifying the surface roughness (Ra) of the substrate supporting features (and thus Ra of the seasoning layer deposited thereon), increasing the substrate backside layer thickness, increasing the number of the supporting features, increasing the density of the substrate supporting features at an outer region of the substrate chucking surface, and lowering the chucking voltage, etc. These approaches provide resistance to degradation of the substrate supporting features and prevent backside damage from penetrating through the backside layers and damaging the layers deposited on the front side of the substrate. Therefore, the focus drift issues during a lithography process as discussed in the background can be prevented or minimized, thereby improving the CD uniformity of the features on the substrate.

While the foregoing is directed to embodiments of the present disclosure, other and further embodiments of the disclosure may be devised without departing from the basic scope thereof.

The invention claimed is:

1. A substrate support, comprising:
   a ceramic body comprising a substrate chucking surface;
   an RF electrode disposed within the ceramic body;
   a heating element embedded in the ceramic body;
   a plurality of substrate supporting features formed on the substrate chucking surface, the plurality of substrate supporting features comprises:
      a first group of supporting features radially disposed in an inner region of the substrate chucking surface at a first radial distance, the first group of supporting features having a first constant density; and
      a second group of supporting features radially disposed in an outer region of the substrate chucking surface at a second radial distance, the second group of supporting features having a second constant density, wherein the outer region surrounds the inner region, the second constant density is greater than the first constant density, and a ratio of the first radial distance to the second radial distance is between 1:1 and 4:1, and wherein a ratio of the second constant density to the first constant density is about 4:1 to about 10:1; and
   a seasoning layer formed on the plurality of the substrate supporting features, the seasoning layer comprising silicon nitride, silicon, or silicon oxide.

2. The substrate support of claim 1, wherein a total number of the plurality of the substrate supporting features is about 1000 or greater.

3. The substrate support of claim 1, wherein the plurality of the substrate supporting features are arranged in concentric circles.

4. The substrate support of claim 1, wherein the plurality of the substrate supporting features have an average surface roughness (Ra) of about 65 µm or less.

5. The substrate support of claim 1, wherein the Ra of the plurality of the substrate supporting features is about 15 µm to about 20 µm.

6. The substrate support of claim 1, wherein the seasoning layer has a hardness in a range of about 5 GPa to about 30 GPa.

7. The substrate support of claim 1, wherein the seasoning layer is silicon nitride.

8. The substrate support of claim 1, wherein the seasoning layer further comprises undoped silicon glass (USG).

9. The substrate support of claim 1, wherein the seasoning layer has a thickness of about 0.5 µm to about 1.2 µm.

10. A substrate support, comprising:
a body comprising a substrate chucking surface, the substrate chucking surface having an inner region and an outer region surrounding the inner region;
an electrode disposed within the body;
a ledge formed about a periphery of the body, the ledge surrounding the outer region; and
a plurality of substrate supporting features formed on the substrate chucking surface, the plurality of the substrate supporting features comprises:
  a first group of supporting features radially disposed in the inner region of the substrate chucking surface at a first radial distance, the first group of supporting features having a first constant density; and
  a second group of supporting features radially disposed in the outer region of the substrate chucking surface at a second radial distance, the second group of supporting features having a second constant density, wherein a ratio of the second constant density to the first constant density is about 4:1 to about 10:1.

11. The substrate support of claim 10, wherein a ratio of the first radial distance to the second radial distance is about 2:1 to about 3:1.

12. The substrate support of claim 10, wherein a total number of the plurality of the substrate supporting features is about 1000 or greater.

13. The substrate support of claim 10, wherein the plurality of the substrate supporting features are arranged in concentric circles.

14. The substrate support of claim 10, wherein the plurality of the substrate supporting features have an average surface roughness (Ra) of about 15 μm to about 20 μm.

15. The substrate support of claim 10, further comprising:
a seasoning layer formed on the plurality of substrate supporting features, wherein the seasoning layer comprises silicon, silicon nitride, silicon oxide, carbon doped silicon oxide (SiOC), silicon carbide (SiC), nitrogen containing silicon carbide (SiCN), aluminum oxide, aluminum nitride, undoped silicon glass (USG), boron-silicate glass (BSG), phosphorus-silicate glass (PSG), boron-phosphorus-silicate glass (BPSG), or any combination thereof.

16. The substrate support of claim 15, wherein the seasoning layer is a bi-layer stack including silicon oxide and silicon nitride.

17. The substrate support of claim 10, wherein each feature of the plurality of substrate supporting features has a diameter of about 1 mm to about 6 mm and a height of about 10 μm to about 50 μm.

18. A substrate support, comprising:
a body comprising a substrate chucking surface;
an electrode disposed in the body;
a temperature control device disposed in the body;
an edge ring disposed about a periphery of the substrate chucking surface;
a plurality of substrate supporting features formed on the substrate chucking surface, wherein the substrate supporting features have a total number of about 1000 or greater, the plurality of substrate supporting features comprises:
  a first group of supporting features radially disposed in an inner region of the substrate chucking surface at a first radial distance, the first group of supporting features having a first constant density; and
  a second group of supporting features radially disposed in an outer region of the substrate chucking surface at a second radial distance, the second group of supporting features having a second constant density, wherein the outer region surrounds the inner region, the second constant density is greater than the first constant density, and a ratio of the first radial distance to the second radial distance is between 1:1 and 4:1, and wherein a ratio of the second constant density to the first constant density is about 4:1 to about 10:1; and
a seasoning layer formed on the plurality of the substrate supporting features, the seasoning layer comprising a silicon oxide and silicon nitride.

19. The substrate support of claim 18, wherein each feature of the plurality of substrate supporting features has a diameter of about 1 mm to about 6 mm and a height of about 10 μm to about 50 μm.

20. The substrate support of claim 18, wherein the seasoning layer further comprises silicon, carbon doped silicon oxide (SiOC), silicon carbide (SiC), nitrogen containing silicon carbide (SiCN), aluminum oxide, aluminum nitride, undoped silicon glass (USG), boron-silicate glass (BSG), phosphorus-silicate glass (PSG), boron-phosphorus-silicate glass (BPSG), or any combination thereof.

* * * * *